(12) United States Patent
Brodsky et al.

(10) Patent No.: US 7,473,101 B2
(45) Date of Patent: Jan. 6, 2009

(54) CONNECTOR FOR MEZZANINE MOUNTING OF A PRINTED WIRING BOARD

(75) Inventors: William L. Brodsky, Binghamton, NY (US); Kevin R. Covi, Glenford, NY (US); Steven G. Shevach, Hurley, NY (US); Mitchell L. Zapotoski, New Paltz, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/381,858

(22) Filed: May 5, 2006

(65) Prior Publication Data

US 2007/0259538 A1 Nov. 8, 2007

(51) Int. Cl.
*H01R 12/00* (2006.01)
(52) U.S. Cl. ......................................................... 439/66
(58) Field of Classification Search .................. 439/65, 439/66
See application file for complete search history.

(56) References Cited

U.S. PATENT DOCUMENTS

| | | | |
|---|---|---|---|
| 3,660,726 A * | 5/1972 | Ammon et al. ............. | 174/262 |
| 3,836,935 A * | 9/1974 | Johnson ....................... | 439/75 |
| 4,029,375 A * | 6/1977 | Gabrielian ................... | 439/66 |
| 4,738,625 A * | 4/1988 | Burton et al. ................ | 439/59 |
| 5,247,250 A * | 9/1993 | Rios ........................... | 324/754 |
| 5,321,884 A * | 6/1994 | Ameen et al. ................ | 29/830 |
| 5,548,486 A * | 8/1996 | Kman et al. .................. | 439/75 |
| 5,599,192 A * | 2/1997 | Olson .......................... | 439/65 |
| 5,618,183 A * | 4/1997 | Gilmore et al. .............. | 439/66 |
| 5,762,504 A * | 6/1998 | Itoh ............................ | 439/66 |
| 6,083,013 A * | 7/2000 | Yamagishi ................... | 439/71 |
| 6,419,500 B1 * | 7/2002 | Kister ......................... | 439/66 |
| 6,545,226 B2 * | 4/2003 | Brodsky et al. ............. | 174/260 |
| 6,676,418 B2 * | 1/2004 | Watanabe .................... | 439/71 |
| 6,818,837 B2 * | 11/2004 | Okami ........................ | 174/260 |
| 7,097,470 B2 * | 8/2006 | Harper, Jr. .................. | 439/83 |
| 7,101,190 B2 * | 9/2006 | Spitler et al. ................ | 439/65 |
| 7,254,889 B1 * | 8/2007 | Cherian ...................... | 29/874 |
| 2005/0181637 A1 * | 8/2005 | Williams et al. ............. | 439/65 |

* cited by examiner

*Primary Examiner*—Chandrika Prasad
(74) *Attorney, Agent, or Firm*—Cantor Colburn LLP

(57) ABSTRACT

A connector for a voltage regulator module (VRM) that provides for a parallel coupling to a printed wiring board (PWB) without surface mounting of the VRM includes a plurality of conductive power blades mounted within slots of insulators. The VRM connector is coupled to PWB and VRM and provides for spacing between the VRM and the PWB. The VRM connector provides for high current flow and reduced circuit heating.

19 Claims, 5 Drawing Sheets

CONNECTOR FOR MEZZANINE MOUNTING OF A PRINTED WIRING BOARD

BACKGROUND OF THE INVENTION

1. Field of the Invention

This invention relates to electrical connectors and particularly to a parallel connection between a voltage regulator module and a printed wiring board.

2. Description of the Related Art

The microprocessors and memory used in today's servers require hundreds of amperes of current at voltages on the order of one volt to operate. The power switching topology commonly used to supply this current is a multi-phase synchronous buck converter, usually referred to as a Voltage Regulator Module (VRM). The VRM converts a comparatively high voltage (12V is most common) into the low-voltage, high-current power source required by the logic. At least one advantage is that the printed-wiring board (PWB) forming the VRM may be optimized for power conversion.

In many applications, VRM circuitry must be mounted directly on the main logic board, in which case the voltage regulator is referred to as a Voltage Regulator Down (VRD). This is usually done when there is insufficient space above the logic board to allow a VRM to be plugged into the logic board (since VRMs plug into the logic board at right angles). Unfortunately, a trade off occurs as VRDs usually have lower efficiency than VRMs (since the PWB of the logic board is typically optimized for signal integrity and not power conversion). Another drawback of VRDs is that they cannot be tested until the logic board has been fully assembled, while VRMs can be tested prior to assembly.

Therefore it would be desirable to have a technique for connecting a VRM, wherein the technique is capable of carrying hundreds of amperes and would allow a VRM to be mounted parallel to a logic board, thereby combining the space efficiency of a VRD with the power and manufacturing efficiency of a VRM.

SUMMARY OF THE INVENTION

Disclosed is an electrical connector for coupling a first printed wiring board parallel to another printed wiring board, the electrical connector including: a plurality of conductive power blades for providing an electrical connection between the first printed wiring board and the another printed wiring board; and an upper insulator including a plurality of slots, each slot for being mated to an upper portion of a respective one of the conductive power blades from the plurality of blades and a lower insulator including a plurality of slots, each slot for being mated to a lower portion of a respective one of the conductive power blades from the plurality of blades; wherein the plurality of conductive power blades is disposed in at least a portion of the plurality of slots in the upper insulator and also disposed in at least a portion of the plurality of slots for the lower insulator; wherein a space between the upper insulator and the lower insulator provides for a separation of the first printed wiring board from the another printed wiring board.

Also disclosed is a method for fabricating an electrical connector for coupling a first printed wiring board parallel to another printed wiring board, the method including: selecting a plurality of conductive power blades for providing an electrical connection between the first printed wiring board and the another printed wiring board; and mating an upper insulator including a plurality of slots to an upper portion of a respective one of the conductive power blades from the plurality of blades and mating a lower insulator including a plurality of slots to a lower portion of a respective one of the conductive power blades from the plurality of blades; wherein a space between the upper insulator and the lower insulator provides for a separation of the first printed wiring board from the another printed wiring board.

Further disclosed is an electrical connector for coupling a voltage regulator module (VRM) parallel to a logic board, the electrical connector including: a plurality of conductive power blades for providing an electrical connection between the VRM and the logic board; and an upper insulator including a plurality of slots, each slot for being mated to an upper portion of a respective one of the conductive power blades from the plurality of blades and a lower insulator including a plurality of slots, each slot for being mated to a lower portion of a respective one of the conductive power blades from the plurality of blades; wherein the plurality of conductive power blades is disposed in at least a portion of the plurality of slots in the upper insulator and also disposed in at least a portion of the plurality of slots for the lower insulator; wherein a space between the upper insulator and the lower insulator provides for a separation of the VRM board from the logic board; wherein each of the conductive power blades are fabricated from a copper alloy; wherein each of the insulators is fabricated from plastic and comprise break-away properties; wherein each of the conductive power blades is adapted to carry a current between the first printed wiring board and the another printed wiring board; wherein dimensions for each of the conductive power blades are about 0.5 mm thick by about 2.5 mm wide and the separation comprises a space of about 7.5 mm; and wherein at least one of the slots and at least one of the conductive power blades comprise a mating feature.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description of the invention explains the preferred embodiments of the invention, together with advantages and features, by way of example with reference to the drawings.

DETAILED DESCRIPTION OF THE INVENTION

Referring now to FIG. 1 through FIG. 5 disclosed herein are apparatus and methods for providing current to a first printed wiring board (PWB) from another printed wiring board. The current is provided from the another printed wiring board (PWB) that provides a voltage regulator module (VRM).

Figure 1:
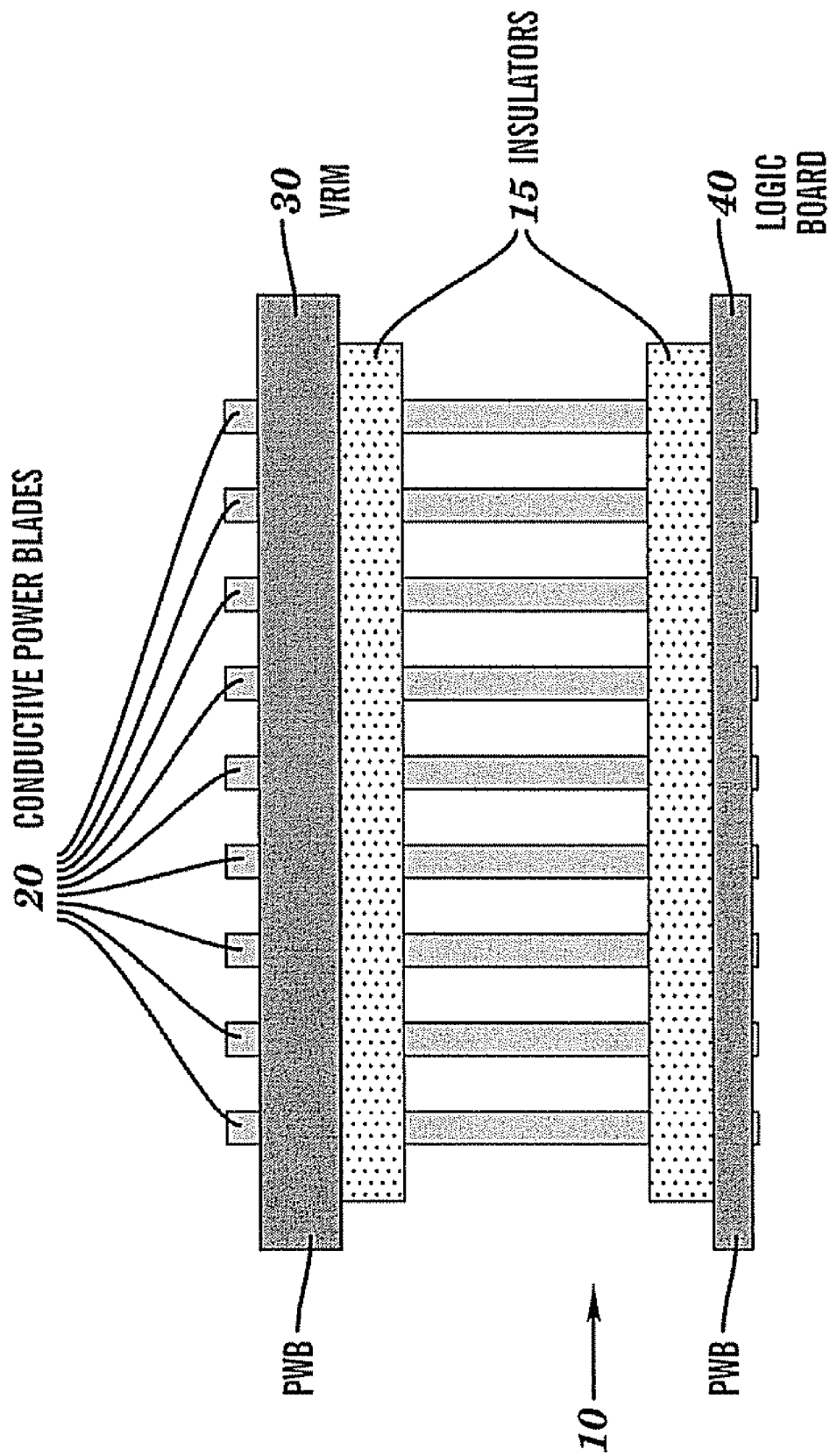
FIG. 1 illustrates one example of an installed connector for placing a Voltage Regulator Module (VRM) in parallel with a logic board.

As depicted in FIG. 1, a VRM connector 10 is provided to couple a VRM 30 to a logic board 40. Using the VRM connector 10, the VRM 30 is coupled to the logic board 40 in parallel. The VRM connector 10 includes a plurality of vertically mounted highly conductive power blades 20. The conductive power blades 20 are typically disposed between the VRM 30 and the logic board 40 using a periodic spacing between the conductive power blades 20. In this manner, the VRM connector 10 provides for passing current between the VRM 30 and the logic board 40 while maintaining a foot print of the VRM 30.

Although discussed in terms of providing a VRM connector 10, the teachings herein provide for techniques for connecting a VRM the first PWB to the another PWB. As the "connector 100" may be assembled in a variety of ways, including during manufacture of the PWB, one skilled in the art will recognize that the term "connector" simply refers to establishing a suitable electrical connection, and contemplates the methods and apparatus therefore.

Figure 2:
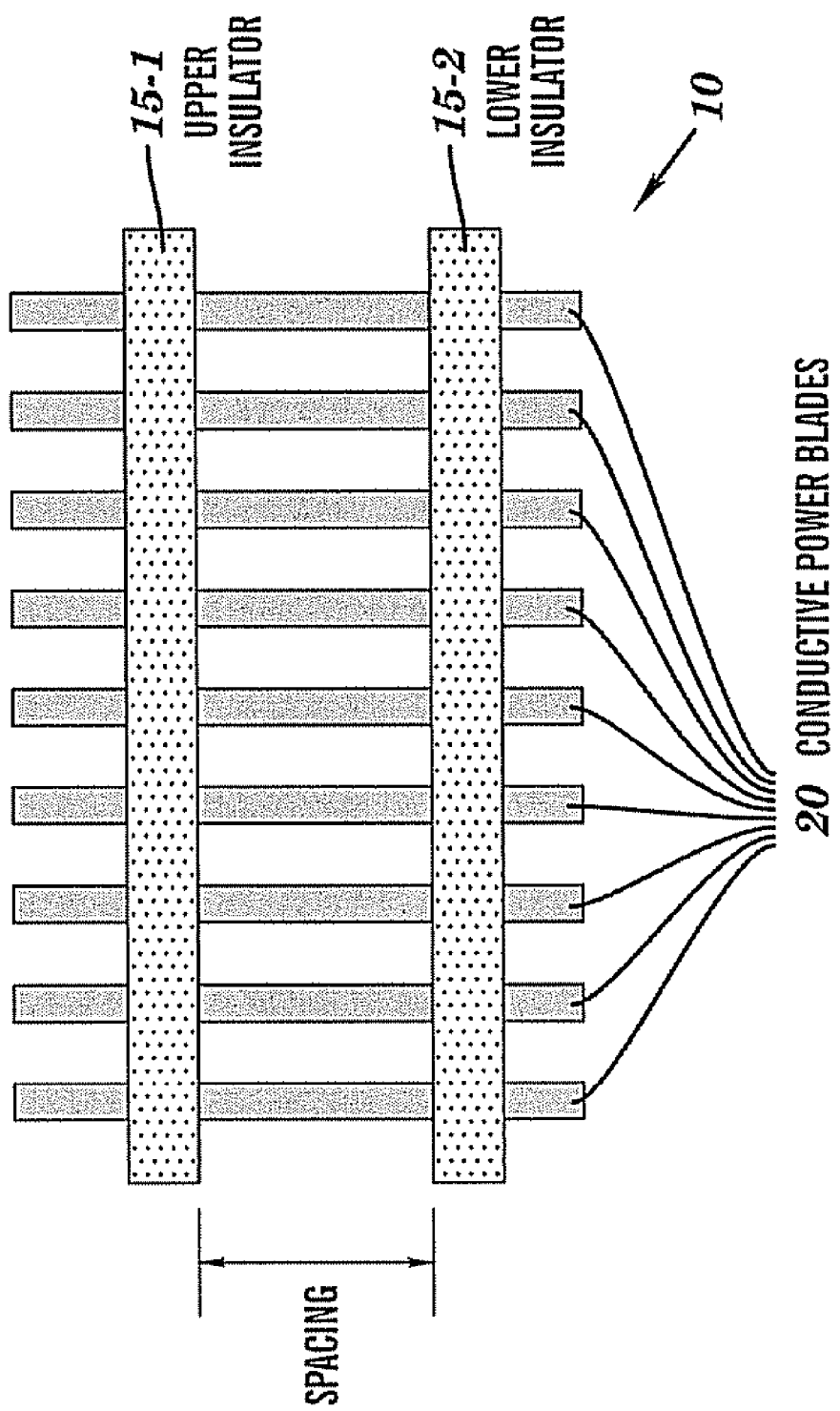
FIG. 2 is a side view of aspects of the connector of FIG. 1.

Referring now to FIG. 2, the VRM connector 10 typically includes at least two insulators 15. In this embodiment, the VRM connector 10 includes at least two insulators 15, first, an upper insulator 15-1 and another insulator 15, referred to as a lower insulator 15-2. The at least two insulators 15 provide for electrical separation between the conductive power blades 20 and portions of the VRM 30 and the logic board 40. The at least two insulators 15 further advantageously provide a degree of physical strength to the VRM connector 10, particularly when the VRM connector 10 is installed. The VRM to logic board electrical separation is provided by a spacing between the at least two insulators 15.

In the embodiment depicted in FIG. 1, the logic board 40 is a first printed wiring board (PWB), while the VRM 30 is another PWB. One skilled in the art will readily understand that many aspects of the first PWB and the another PWB may be varied. For example, the first PWB may include components other than a logic board 40. Accordingly, the terms "VRM 30" and "logic board 40" are merely illustrative and not limiting of aspects of the VRM connector 10, and may be considered, at least in some instances, to be synonymous with the term printed wiring board (PWB).

Figure 3:
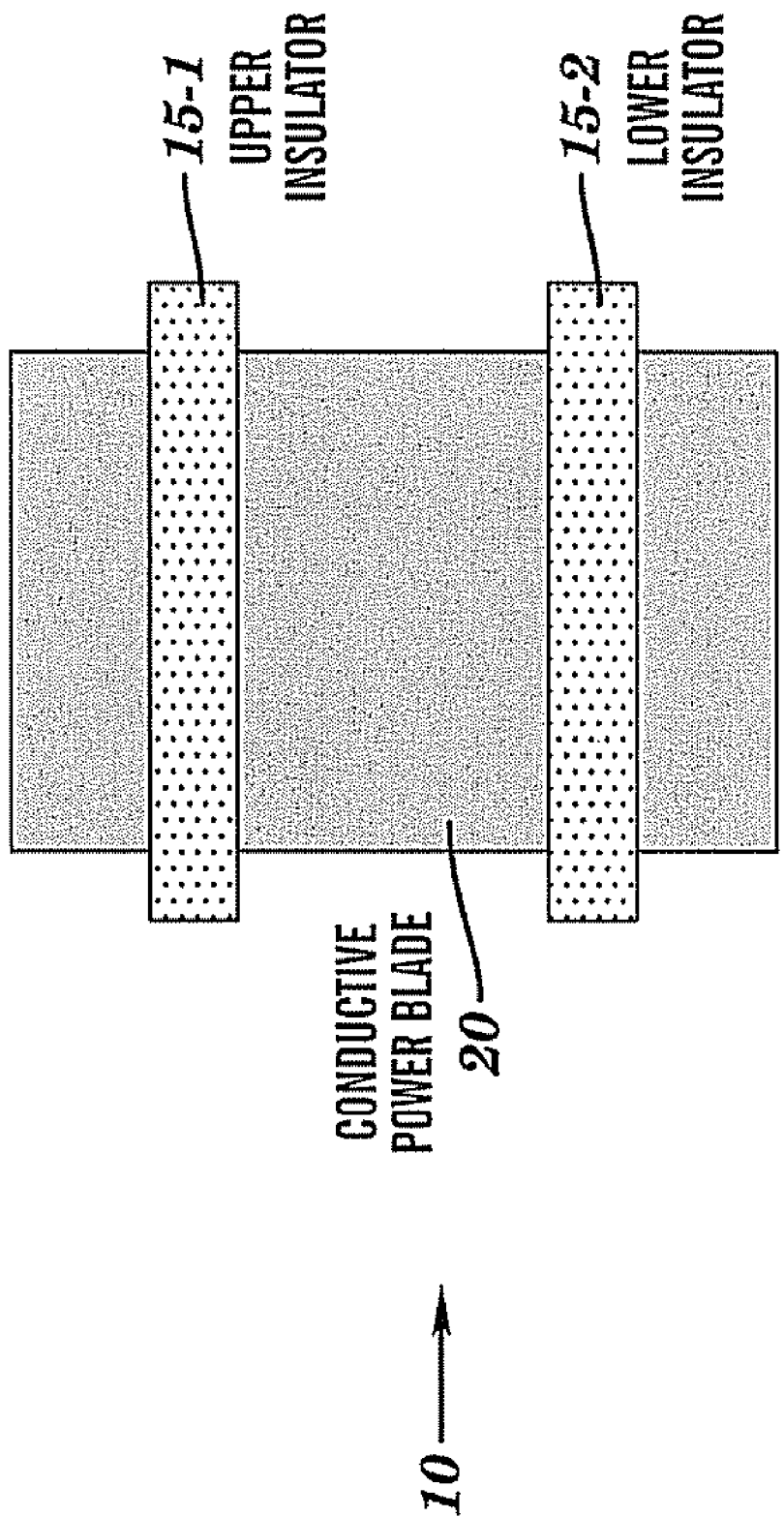
FIG. 3 is an end view of aspects of the connector of FIG. 1.
Figure 4:
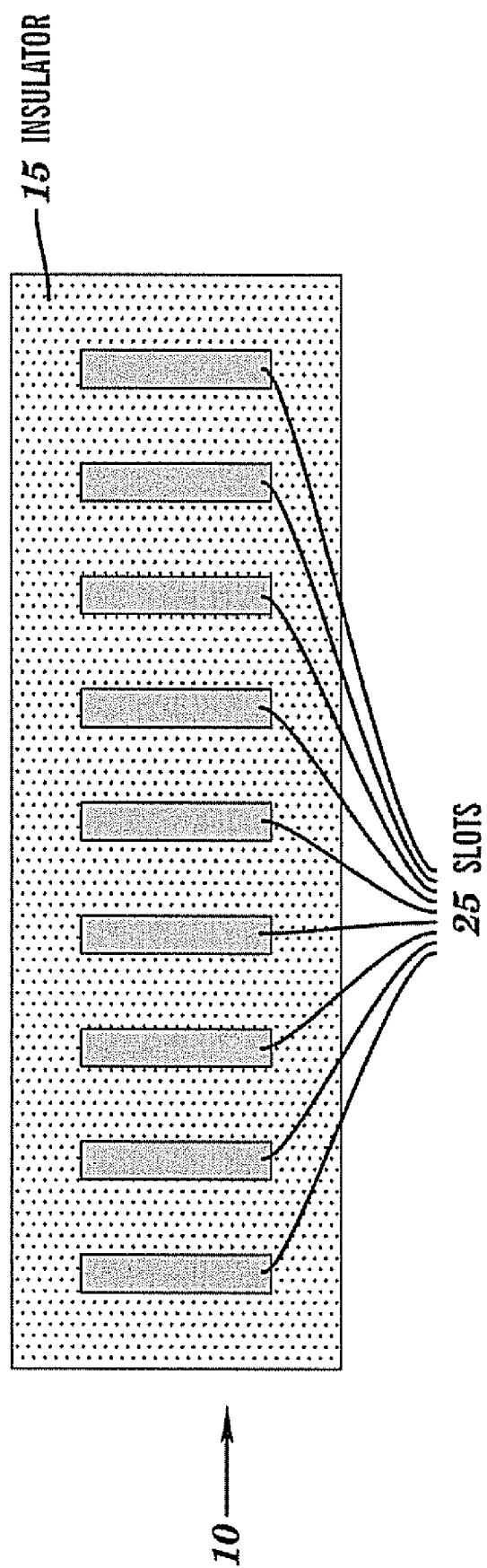
FIG. 4 is a top view of an insulator for the connector of FIG. 1.

FIG. 3 depicts the exemplary VRM connector 10 from the side. In FIG. 4, depicts a top view of one of the insulators 15, wherein a plurality of slots 25 are included for accepting the plurality of conductive power blades 20.

In some embodiments, the VRM connector 10 is used as a part of a Distributed Converter Assembly (DCA), which is a multi-output power supply. In certain embodiments, a plurality of VRM 30 are coupled to the logic board 40 using a plurality of VRM connectors 10. Further, varying aspects of the VRM connectors 10 within the plurality thereof may be used to advantageously provide for compact implementation of VRM 30 couplings. For example, multi-level spacing may be realized to provide for small footprint implementations.

Typically, a straight blade of high conductivity material (e.g., a copper alloy) is used as the conductive power blade 20, although other materials may be used. When copper blades are used a preventive metallic plating of tin, nickel, or similar material maybe added to reduce corrosion and improve solderability. Each conductive power blade 20 is typically assembled into each of the at least two insulators 15 so the conductive power blades 20 are positioned according to a predetermined spacing. Various factors, such as electrical properties and current values may be considered when designing the conductive power blades 20 and the placement thereof. The conductive power blades 20 may include physical features such as mounting collars (not shown) to provide for robust physical coupling to at least one of the at least two insulators 15.

As can be seen, particularly with reference to FIG. 2, each of the insulators 15 surrounds a portion of each of the conductive power blades 20. That is, the upper insulator 15-1 surrounds an upper portion of each of the conductive power blades 20, and the lower insulator 15-2 surrounds a lower portion of each of the conductive power blades 20.

Typically, each of the at least two insulators 15 include an insulative body (e.g., plastic). Also typically, each of the at least two insulators 15 provide for a predetermined space between each of the two PWB. In some embodiments, at least one of the at least two insulators 15 is fabricated incorporating break-away properties, such as, for example, notches in the material of the insulator for easy breakage and separation. In this manner, the length each of the VRM connectors 10 could be modified by breaking the insulators 15 at a desired length.

Having vertically positioned conductive power blades 20 provides for a relatively low bulk resistance and increased connection area from each of the conductive power blades 20 to each of the PWB (the VRM 30 power plane or the logic board 40).

Increasing of the conductive power blade 20 to connection area reduces any resistance in a connection and advantageously increases a thermal conductivity of the connection. Both of these attributes lower an operating temperature associated with each connection, thus providing for a higher current carrying capacity for the connection.

In typical embodiments, stamping dies for fabrication of the conductive power blades 20 are made to accommodate a range of lengths for each of the conductive power blades 20. This allows one set of stamping dies to provide for fabrication of a range of VRM connectors 10 supportive of various PWB spacing heights.

The insulators 15 of the VRM connector 10 may be fabricated using known techniques, such as injection molding. A body of each of the insulators 15 can be molded with user selectable break points, thus providing for use of one mold for multiple part lengths.

Each of the conductive power blades 20 may be retained (i.e., mated) within each of the insulators by friction (or interference fit) or mechanically retained (e.g., a notch feature, a collar or the like).

In typical embodiments, dimensions for each of the conductive power blades 20 are about 0.5 mm thick by about 2.5 mm wide. These exemplary dimensions are compatible with commercially available wire headers used to provide signal connections. Typically, a spacing between each of the PWB is about 7.5 mm.

Typically, when installed, a solder tail length for the VRM connector 10 is defined by a thickness of the PWB. The tail length can be adjusted or controlled and different on each end of the conductive power blade 20 to accommodate optimized PWB cross-sections of VRM PWB 30 and logic board PWB 40.

Several key advantages to the VRM connector 10 include a low resistance connection between the VRM 30 and the logic board 40 that: limits circuit resistive heating; provides a low thermal resistance from a point of connection to the PWB or VRM power planes; and ability to easily vary PWB to PWB spacing through flexible connection design and manufacturing tool set. These are significant requirements that this invention meets. An additional feature of the conductive power blade structure is the additional heat transfer or heat-sinking that can obtained when cooling air is forced through spaces between conductive power blades 20. Since member 20 is connected to power planes of VRM PWB and Logic PWB with a connection with relatively low thermal resistance, when air is forced through conductive power blades 20 the heat internal to PWB's will be conducted through blades 20 to cooling air and provide additional cooling for PWB assemblies.

Figure 5:
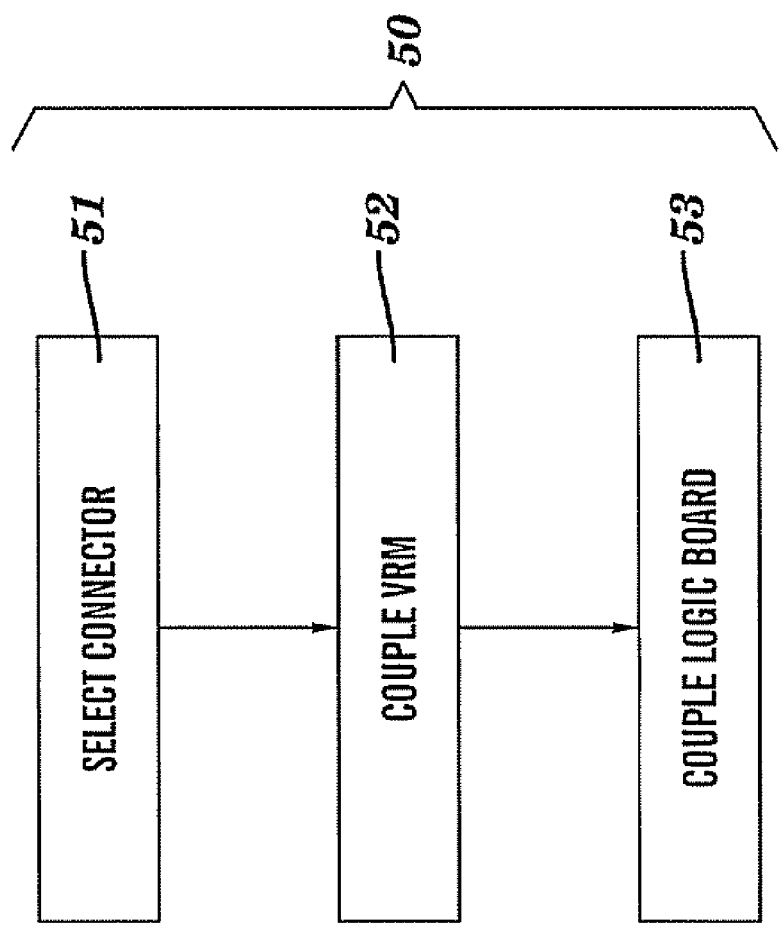
FIG. 5 depicts an exemplary process for using the connector of FIG. 1.

FIG. 5 depicts an exemplary embodiment for providing a VRM connection to a PWB. In FIG. 5, parallel coupling 50 VRM calls for selecting the VRM connector 10 fabricated in accordance with the teachings herein, coupling the VRM 30 to the VRM connector 10, electrically testing with connector 10 assembled (using a separable connector not shown, (in some cases, this process includes a rework loop if VRM fails test) and coupling the VRM connector 10 to the logic board 40. Of course, this simple procedure may understandably be varied considerably, and as such the method for parallel coupling 50 is a non-limiting and only illustrative method.

One or more aspects of the present invention can be included in an article of manufacture (e.g., one or more computer products) having, for instance, computer usable media. The article of manufacture can be included as a part of a computer system, such as a server, a power supply and may be sold separately or in other components.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. An electrical connector for coupling a first printed wiring board parallel to another printed wiring board, the electrical connector comprising:
    a plurality of straight conductive power blades for providing an electrical connection between the first printed wiring board and the another printed wiring board; and
    an upper insulator comprising a plurality of slots, each slot for being mated to an upper portion of a respective one of the conductive power blades from the plurality of blades and a lower insulator comprising a plurality of slots, each slot for being mated to a lower portion of a respective one of the conductive power blades from the plurality of blades;
    wherein the plurality of conductive power blades is disposed in at least a portion of the plurality of slots in the upper insulator and also disposed in at least a portion of the plurality of slots for the lower insulator, wherein the disposition holds together the upper insulator and the lower insulator; and
    wherein a space between the upper insulator and the lower insulator provides for a separation of the first printed wiring board from the another printed wiring board.

2. The electrical connector as in claim 1, wherein one of the first printed wiring board and the another printed wiring board comprise one of a voltage regulator module and a logic board.

3. The electrical connector as in claim 1, wherein each of the conductive power blades are fabricated from at least one of copper, a copper alloy, tin and nickel.

4. The electrical connector as in claim 1, wherein each of the insulators is fabricated from plastic.

5. The electrical connector as in claim 1, wherein each of the insulators comprises a user selectable break point.

6. The electrical connector as in claim 1, wherein each of the conductive power blades is adapted to carry a current between the first printed wiring board and the another printed wiring board.

7. The electrical connector as in claim 1, wherein dimensions for each of the conductive power blades are about 0.5 mm thick by about 2.5 mm wide.

8. The electrical connector as in claim 1, wherein the separation comprises a space of about 7.5 mm.

9. The electrical connector as in claim 1, wherein at least one of the slots and at least one of the conductive power blades comprise a mating feature.

10. The electrical connector as in claim 5, wherein the user selectable break point comprises a notch.

11. The electrical connector as in claim 10, wherein the notch is molded into each of the insulators.

12. A method for fabricating an electrical connector for coupling a first printed wiring board parallel to another printed wiring board, the method comprising:
    selecting a plurality of straight conductive power blades for providing an electrical connection between the first printed wiring board and the another printed wiring board; and
    mating an upper insulator comprising a plurality of slots to an upper portion of a respective one of the conductive power blades from the plurality of blades and mating a lower insulator comprising a plurality of slots to a lower portion of a respective one of the conductive power blades from the plurality of blades;
    wherein a space between the upper insulator and the lower insulator provides for a separation of the first printed wiring board from the another printed wiring board.

13. The method as in claim 12, wherein the selecting comprises selecting conductive power blades fabricated from at least one of copper, a copper alloy, tin and nickel.

14. The method as in claim 12, wherein mating comprises one of friction fitting, interference fitting and mechanically retaining.

15. The method as in claim 12, wherein the plurality of conductive power blades is mated to at least a portion of the plurality of slots in the upper insulator.

16. The method as in claim 12, wherein the plurality of conductive power blades is mated to at least a portion of the plurality of slots in the lower insulator.

17. The method as in claim 12, further comprising breaking each of the insulators at a user selectable break point.

18. The method as in claim 17, wherein the user selectable breakpoint comprises a notch.

19. An electrical connector for coupling a voltage regulator module (VRM) parallel to a logic board, the electrical connector comprising:
    a plurality of straight conductive power blades for providing an electrical connection between the VRM and the logic board; and
    an upper insulator comprising a plurality of slots, each slot for being mated to an upper portion of a respective one of the conductive power blades from the plurality of blades and a lower insulator comprising a plurality of slots, each slot for being mated to a lower portion of a respective one of the conductive power blades from the plurality of blades;

wherein the plurality of conductive power blades is disposed in at least a portion of the plurality of slots in the upper insulator and also disposed in at least a portion of the plurality of slots for the lower insulator, wherein the disposition holds together the upper insulator and the lower insulator; and wherein a space between the upper insulator and the lower insulator provides for a separation of the VRM board from the logic board;

wherein each of the conductive power blades are fabricated from a copper alloy;

wherein each of the insulators is fabricated from plastic and comprise a user selectable break point;

wherein each of the conductive power blades is adapted to carry a current between the first printed wiring board and the another printed wiring board;

wherein dimensions for each of the conductive power blades are about 0.5 mm thick by about 2.5 mm wide and the separation comprises a space of about 7.5 mm; and wherein at least one of the slots and at least one of the conductive power blades comprise a mating feature.

* * * * *